(12) United States Patent
Maxim et al.

(10) Patent No.: US 9,559,644 B2
(45) Date of Patent: Jan. 31, 2017

(54) LOW NOISE AMPLIFIER

(71) Applicant: RF Micro Devices, Inc., Greensboro, NC (US)

(72) Inventors: George Maxim, Saratoga, CA (US); Dirk Robert Walter Leipold, San Jose, CA (US); Baker Scott, San Jose, CA (US); Ralph Christopher Nieri, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/931,448

(22) Filed: Nov. 3, 2015

(65) Prior Publication Data

US 2016/0126906 A1    May 5, 2016

Related U.S. Application Data

(60) Provisional application No. 62/074,432, filed on Nov. 3, 2014.

(51) Int. Cl.

| | |
|---|---|
| *H03F 3/04* | (2006.01) |
| *H03F 3/193* | (2006.01) |
| *H03F 1/26* | (2006.01) |
| *H04B 1/10* | (2006.01) |
| *H04B 7/08* | (2006.01) |
| *H04W 72/04* | (2009.01) |
| *H03F 1/02* | (2006.01) |
| *H03F 1/22* | (2006.01) |

(52) U.S. Cl.
CPC ............ *H03F 3/193* (2013.01); *H03F 1/0261* (2013.01); *H03F 1/223* (2013.01); *H03F 1/26* (2013.01); *H04B 1/1036* (2013.01); *H04B 7/08* (2013.01); *H04W 72/04* (2013.01); *H03F 2200/294* (2013.01); *H03F 2200/451* (2013.01); *H03F 2200/492* (2013.01); *H04B 2001/1063* (2013.01)

(58) Field of Classification Search
CPC ........................................................ H03F 3/04
USPC ......................................... 330/311, 277, 296
See application file for complete search history.

(56) References Cited

U.S. PATENT DOCUMENTS

| | | | |
|---|---|---|---|
| 6,211,659 B1 * | 4/2001 | Singh ...................... | G05F 3/262 323/315 |
| 8,405,147 B2 * | 3/2013 | Brindle ............. | H01L 29/78609 257/341 |

(Continued)

*Primary Examiner* — Patricia T Nguyen
(74) *Attorney, Agent, or Firm* — Withrow & Terranova, P.L.L.C.

(57) ABSTRACT

Circuitry includes a floating-body main field-effect transistor (FET) device, a body-contacted cascode FET device, and biasing circuitry coupled to the floating-body main FET device and the body-contacted cascode FET device. The floating-body main FET device includes a gate contact, a drain contact, and a source contact. The body-contacted cascode FET device includes a gate contact, a drain contact coupled to a supply voltage, and a source contact coupled to the drain contact of the floating-body main FET device and to a body region of the body-contacted cascode FET device. The biasing circuitry is coupled to the gate contact of the floating-body main FET device and the gate contact of the body-contacted cascode FET device and configured to provide biasing signals to the floating-body main FET device and the body-contacted cascode FET device such that a majority of the supply voltage is provided across the body-contacted cascode FET device.

20 Claims, 9 Drawing Sheets

(56) References Cited

U.S. PATENT DOCUMENTS

| | | | |
|---|---|---|---|
| 8,723,260 B1* | 5/2014 | Carroll | H01L 21/84 257/347 |
| 2003/0169111 A1* | 9/2003 | Ivanov | H03F 3/3028 330/253 |
| 2004/0070900 A1* | 4/2004 | Ker | H01L 27/0266 361/56 |
| 2009/0057758 A1* | 3/2009 | Lee | H01L 29/063 257/337 |
| 2013/0057349 A1* | 3/2013 | Jo | H03F 1/223 330/277 |
| 2013/0193525 A1* | 8/2013 | Weis | H03K 17/063 257/379 |

* cited by examiner

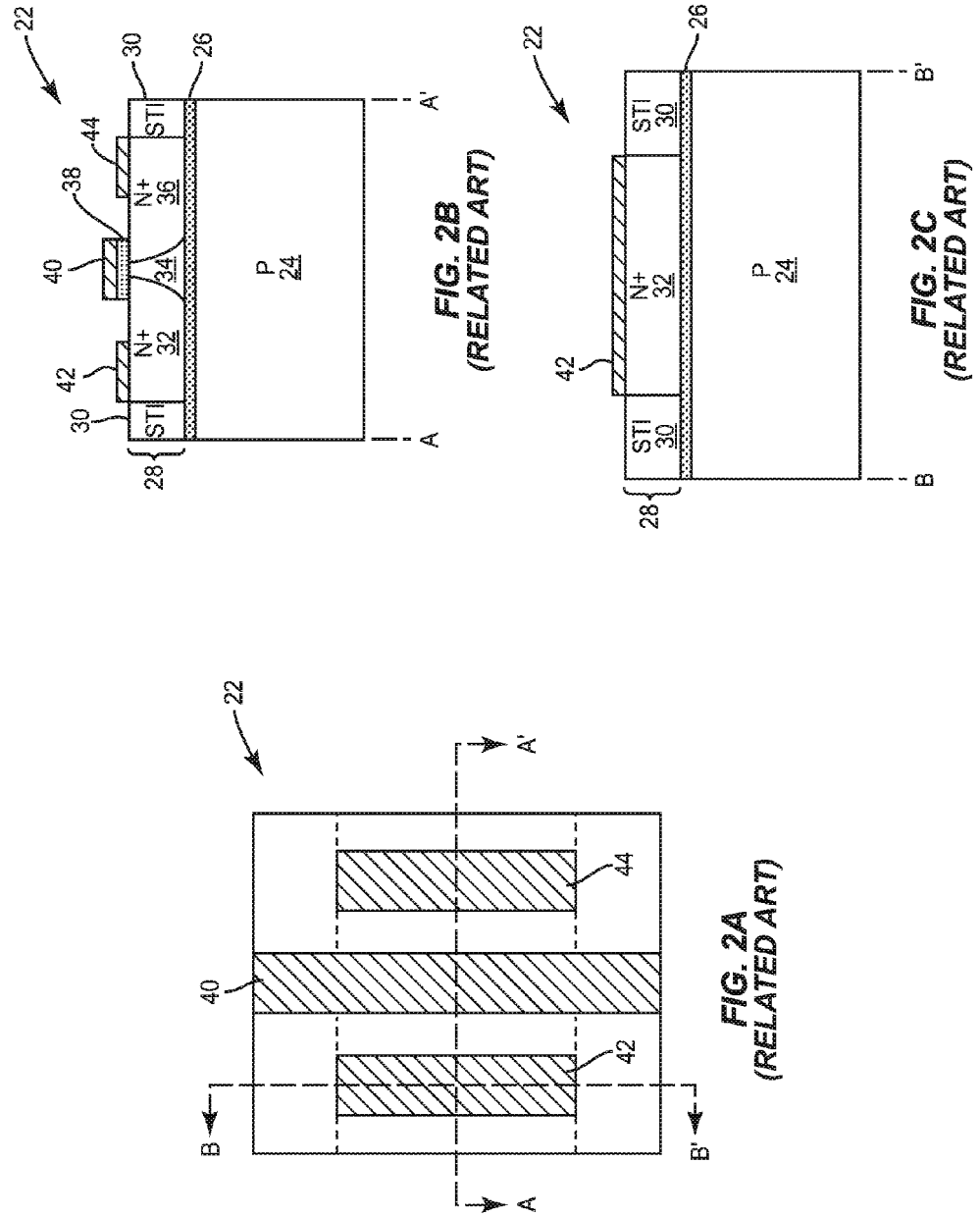

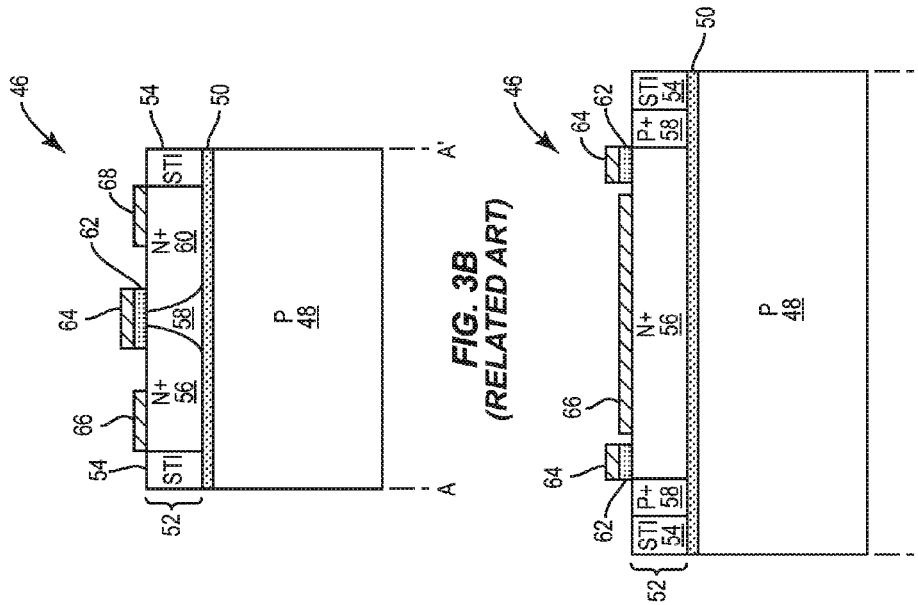
FIG. 3B
(RELATED ART)
FIG. 3C
(RELATED ART)
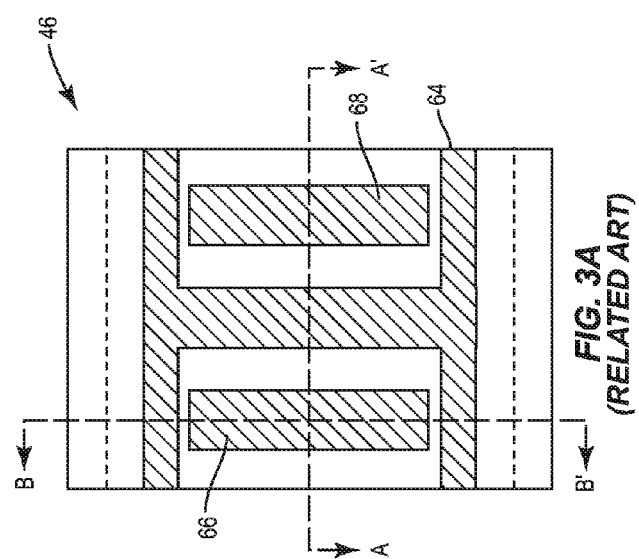
FIG. 3A
(RELATED ART)

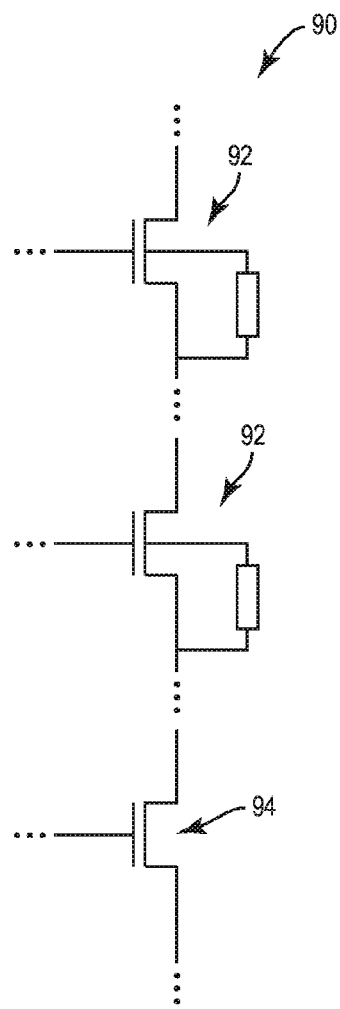 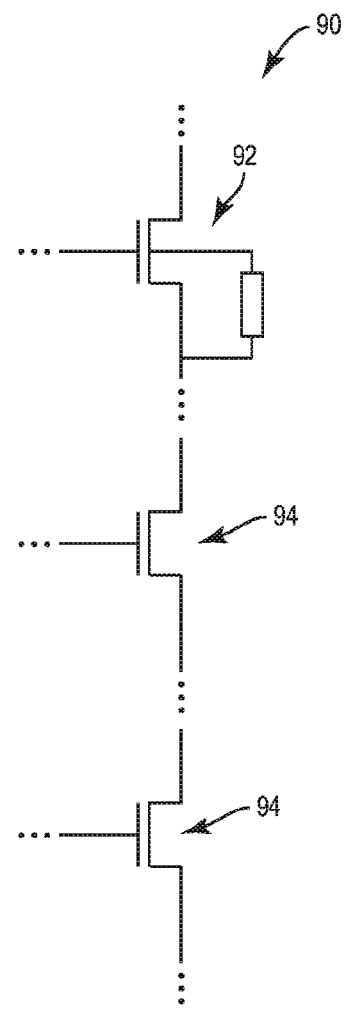
*FIG. 6A*  *FIG. 6B*

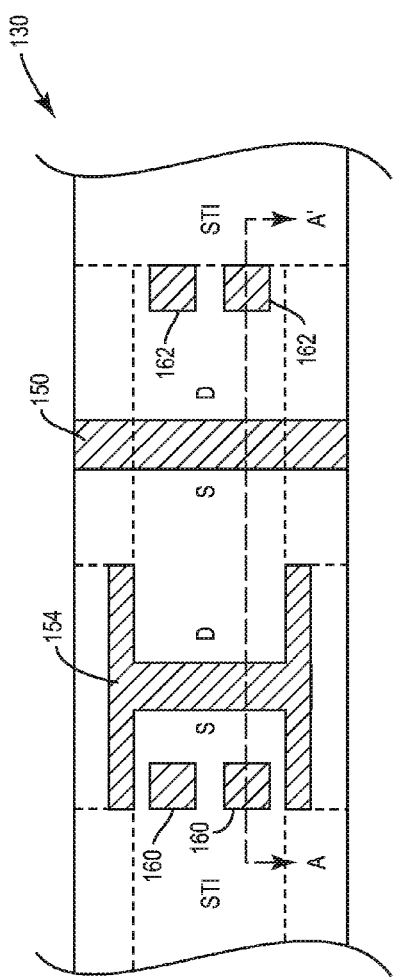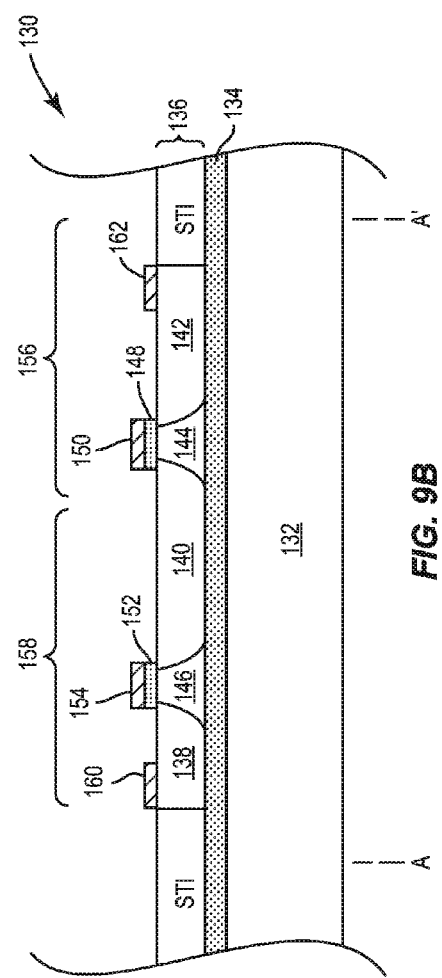
FIG. 9A
FIG. 9B

LOW NOISE AMPLIFIER

RELATED APPLICATIONS

This application claims the benefit of U.S. provisional patent application No. 62/074,432, filed Nov. 3, 2014, the disclosure of which is incorporated herein by reference in its entirety.

FIELD OF THE DISCLOSURE

The present disclosure relates to stacked transistor configurations, and specifically to stacked transistor configurations for use in low noise amplifiers (LNAs).

BACKGROUND

Low noise amplifiers (LNAs) are extensively used in radio frequency (RF) circuitry such as RF front end circuitry. FIG. 1 shows a conventional LNA 10. The conventional LNA 10 includes a main transistor 12, a cascode transistor 14, and biasing circuitry 16. The main transistor 12 includes a gate contact G coupled to both the biasing circuitry 16 and an input node 18, a source contact S coupled to ground via an isolation inductor L_IS, and a drain contact D. The cascode transistor 14 includes a gate contact G coupled to the biasing circuitry 16, a drain contact D coupled to both a supply voltage VCC via an isolation inductor L_IS and an output node 20, and a source contact S coupled to the drain contact D of the main transistor 12.

In operation, the biasing circuitry 16 provides biasing signals to the gate contact G of the main transistor 12 and the cascode transistor 14. Generally, the biasing signals are provided such that a majority of the supply voltage VCC is distributed across the main transistor 12. Signals provided at the input node 18 are amplified by the main transistor 12 and the cascode transistor 14 by modulating the supply voltage VCC, and are provided at the output node 20. Due to the biasing of the main transistor 12 and the cascode transistor 14 discussed above, the main transistor 12 performs the transconductance amplification, while the cascode transistor 14 performs the transresistance amplification.

In the conventional LNA 10, the main transistor 12 and the cascode transistor 14 are silicon on insulator (SOI) metal-oxide semiconductor field-effect transistors (MOSFETs). SOI MOSFETs are available in floating-body and body-contacted configurations. FIGS. 2A through 2C show an exemplary floating-body SOI MOSFET 22. Specifically, FIG. 2A shows a top view of the floating-body SOI MOSFET 22, FIG. 2B shows a first cross-sectional view of the floating-body SOI MOSFET 22 taken through A-A$^1$ of FIG. 2A, and FIG. 2C shows a second cross-sectional view of the floating-body SOI MOSFET 22 taken through B-B$^1$ of FIG. 2A. The floating-body SOI MOSFET 22 includes a substrate 24, a buried oxide layer 26 on the substrate 24, and a device layer 28 on the buried oxide layer 26. The device layer 28 includes a number of shallow trench isolation (STI) regions 30, which surround a source region 32, a body region 34, and a drain region 36. The source region 32 and the drain region 36 are separated by the body region 34. A gate oxide layer 38 is on the body region 34 and a portion of the source region 32 and the drain region 36. A gate contact 40 is on the gate oxide layer 38. A source contact 42 is on the source region 32, and a drain contact 44 is on the drain region 36.

FIGS. 3A through 3C show a body-contacted SOI MOSFET 46. Specifically, FIG. 3A shows a top view of the body-contacted SOI MOSFET 46, FIG. 3B shows a first cross-sectional view of the body-contacted SOI MOSFET 46 taken through A-A$^1$ of FIG. 3A, and FIG. 3C shows a second cross-sectional view of the body-contacted SOI MOSFET 46 taken through B-B$^1$ of FIG. 3A. The body-contacted SOI MOSFET 46 includes a substrate 48, a buried oxide layer 50 on the substrate 48, and a device layer 52 on the buried oxide layer 50. The device layer 52 includes a number of STI regions 54, which surround a source region 56, a body region 58, and a drain region 60. The source region 56 and the drain region 60 are separated by the body region 58. A gate oxide layer 62 is on the body region 58 and a portion of the source region 56 and the drain region 60. A gate contact 64 is on the gate oxide layer 62. A source contact 66 is on the source region 56 and a drain contact 68 is on the drain region 60. As shown in the top view of the body-contacted SOI MOSFET 46 shown in FIG. 3A, the gate oxide layer 62 and the gate contact 64 are formed in an "H" shape. Further, the body region 58 is extended above a top portion and a bottom portion (i.e., the outer sides of the "H" shape) of the gate oxide layer 62 and the gate contact 64. The "H" shape of the gate oxide layer 62 and the gate contact 64 separates this additional body region 58 from the source region 56 and the drain region 60 and terminates any parasitic channel effects that may occur at the edge of the additional body region 58. Essentially, the "H" shape of the gate oxide layer 62 and the gate contact 64 acts as a mask to form the various regions of the body-contacted SOI MOSFET 46. A "T" shape, an "L" shape, and a "U" shape may also be used for the gate oxide layer 62 and the gate contact 64, as required by the particular layout of the body region 58. While not shown, a silicide layer may connect the source region 56 and the body region 58 such that the body-contacted SOI MOSFET 46 is a source-to-body connected SOI MOSFET. This may require a break in the gate oxide layer 62 and the gate contact 64 (not shown).

Generally, floating-body SOI MOSFETs have higher transconductance than their body-contacted counterparts. Further, the footprint of body-contacted SOI MOSFETs is often larger than floating-body SOI MOSFETs due to the extra area required for the extended body region. This generally brings extra parasitic capacitance and thus a lower transition frequency ($f_t$). Accordingly, floating-body SOI MOSFETs are generally the preferred configuration for SOI MOSFETs used in LNAs.

While floating-body SOI MOSFETs are generally preferred over body-contacted SOI MOSFETs for LNAs, these devices exhibit a marked increase in noise when operated at high drain-to-source voltages. Further, fluctuations in the supply voltage provided to floating-body SOI MOSFETs may result in significant increases in noise. This is due to the well-known phenomena of charge storage within the floating-body region, which changes the threshold voltage of the device and causes a "kink" in the current vs. voltage response thereof. FIG. 4 illustrates a drain current density vs. drain-to-source voltage response of a floating-body SOI MOSFET for both a partial depletion and a total depletion device (the partial depletion device is shown as a dashed line 70 and the total depletion device is shown as a solid line 72). As shown in FIG. 4, the current density in each device remains relatively constant to a particular voltage, after which a "kink" in the response is presented. This "kink" results in significant distortion due to a non-linear response of the device. To avoid such effects, the biasing circuitry 16 discussed above generally attempts to bias the main transistor 12 at a voltage below the "kink" and the cascode transistor 14 at a voltage above the "kink". However, changing supply voltages due to different battery conditions in a mobile device may make it impossible to avoid these "kinks" and thus result in significant distortion in the conventional LNA 10. Specifically, as the supply voltage is reduced due to battery discharge, it may cause one of the main transistor 12 and the cascode transistor 14 to reach the "kink" and therefore exhibit a non-linear response.

Body-contacted SOI MOSFET devices do not suffer from the aforementioned noise problems and do not experience the "kink" effect as described above. This is illustrated in FIG. 4 by a long-dashed line 74. As shown in FIG. 4, the current density vs. voltage response of a body-connected device remains relatively linear over most of the voltage range. This is due to the fact that charge carriers may be removed from the body as necessary via the contacted body, thereby avoiding a change in threshold voltage as charge carriers accumulate in the body. However, using body-contacted SOI MOSFET devices in place of the floating-body SOI MOSFET devices generally results in similarly poor performance due to the relatively low transconductance and higher junction capacitance of these devices. Accordingly, there is a need for an LNA with improved performance at high frequencies.

SUMMARY

The present disclosure relates to stacked transistor configurations, and specifically to stacked transistor configurations for use in low noise amplifiers (LNAs). In one embodiment, circuitry includes a floating-body main field-effect transistor (FET) device, a body-contacted cascode FET device, and biasing circuitry coupled to the floating-body main FET device and the body-contacted cascode FET device. The floating-body main FET device includes a gate contact, a drain contact, and a source contact. The body-contacted cascode FET device includes a gate contact, a drain contact coupled to a supply voltage, and a source contact coupled to the drain contact of the floating-body main FET device and to a body region of the body-contacted cascode FET device. The biasing circuitry is coupled to the gate contact of the floating-body main FET device and the gate contact of the body-contacted cascode FET device and configured to provide biasing signals to the floating-body main FET device and the body-contacted cascode FET device such that a majority of the supply voltage is provided across the body-contacted cascode FET device. Using the floating-body main FET device along with the body-contacted cascode FET device and biasing the devices such that a majority of the supply voltage is across the body-contacted cascode FET device provides the higher transconductance of the floating-body device with the reduced distortion and noise of the body-contacted device, thereby providing a stacked transistor pair with increased performance.

In one embodiment, the biasing circuitry is configured to provide the biasing signals to the floating-body main FET device and the body-contacted cascode FET device such that at least 75% of the supply voltage is provided across the body-contacted cascode FET device.

In one embodiment, the biasing circuitry is configured to provide the biasing signals to the floating-body main FET device and the body-contacted cascode FET device such that a drain-to-source voltage of the floating-body main FET device is less than about 1.5V.

In one embodiment, the supply voltage is between about 1.0V and 6.0V. The circuitry may include power supply circuitry configured to provide the supply voltage. Further, the circuitry may include an input node coupled to the gate contact of the floating-body main FET device and an output node coupled to a drain contact of the body-contacted FET device. The floating-body main FET device and the body-contacted cascode FET device may thus be configured to amplify a signal provided at the input node using the supply voltage and provide the amplified input signal at the output node.

In one embodiment, the floating-body main FET device and the body-contacted cascode FET device are silicon-on-insulator (SOI) devices. Specifically, the floating-body main FET device and the body-contacted cascode FET device may be metal-oxide-semiconductor field-effect transistors (MOSFETs). Further, the floating-body main FET device and the body-contacted cascode FET device may be thin-film SOI devices, and further may be either partially or fully depleted devices.

In one embodiment, the floating-body main FET device and the body-contacted cascode FET device are monolithically integrated on a single semiconductor die. Further, the floating-body main FET device and the body-contacted cascode FET device may share at least one diffusion.

In one embodiment, circuitry includes one or more floating-body main field-effect transistor (FET) devices, one or more body-contacted cascode FET devices, and biasing circuitry coupled to the one or more floating-body main FET devices and the one or more body-contacted cascode FET devices. The one or more body-contacted cascode FET devices are coupled in series with the one or more floating-body main FET devices. The biasing circuitry is coupled to a gate contact of each one of the one or more floating-body main FET devices and a gate contact of each one of the one or more body-contacted cascode FET devices and configured to provide biasing signals to the one or more floating-body main FET devices and the one or more body-contacted cascode FET devices such that a source-to-drain voltage of each one of the floating-body main FET devices is less than about 1.5V. Using the one or more floating-body main FET devices along with the one or more body-contacted cascode FET devices and biasing the devices as described provides the higher transconductance of the one or more floating-body devices with the reduced distortion of the one or more body-contacted devices, thereby providing a stacked transistor pair with increased performance.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 2A through 2C show various depictions of a conventional floating-body thin-film silicon-on-insulator (SOI) metal-oxide-semiconductor field-effect transistor (MOSFET).

FIGS. 3A through 3C show various depictions of a conventional body-contacted thin-film SOI MOSFET.

FIGS. 6A and 6B are schematic representations of various transistor stacks according to embodiments of the present disclosure.

FIGS. 9A and 9B show various depictions of a semiconductor die according to one embodiment of the present disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 5:
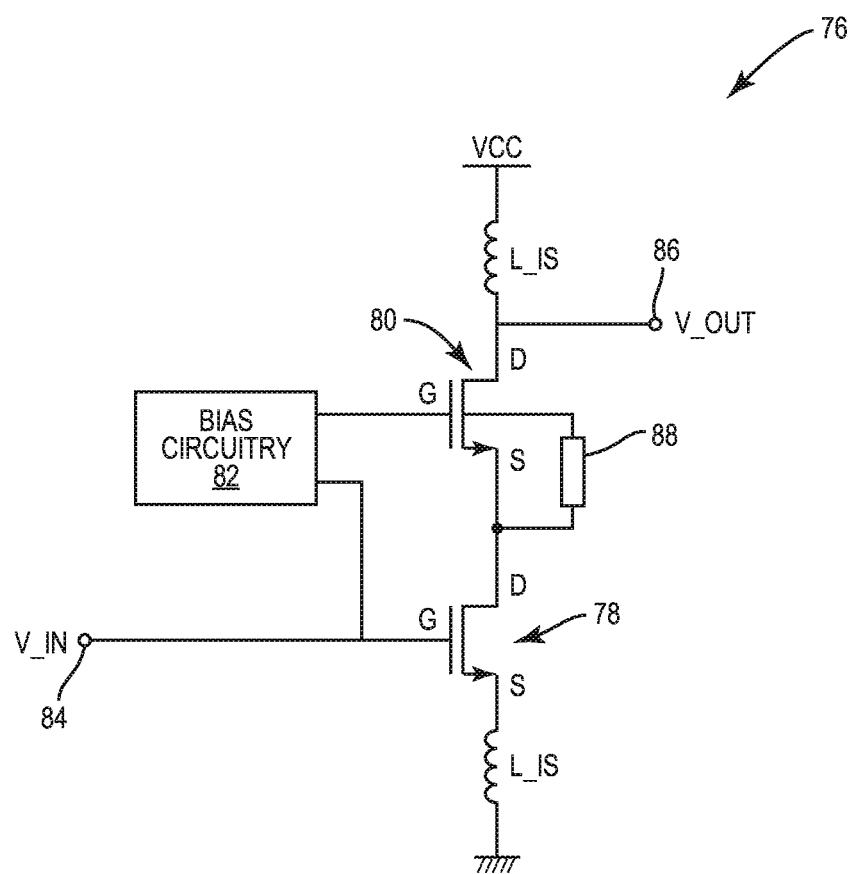
FIG. 5 is a schematic representation of a transistor stack according to one embodiment of the present disclosure.

FIG. 5 shows a stacked transistor pair 76 according to one embodiment of the present disclosure. The stacked transistor pair 76 includes a main transistor 78, a cascode transistor 80, and biasing circuitry 82. The main transistor 78 includes a gate contact G coupled to both the biasing circuitry 82 and an input node 84, a source contact S coupled to ground via an isolation inductance L_IS, and a drain contact D. The cascode transistor 80 includes a gate contact G coupled to the biasing circuitry 82, a drain contact D coupled to both a supply voltage VCC via an isolation inductor L_IS and an output node 86, and a source contact S coupled to the drain contact D of the main transistor 78. Notably, the isolation inductors L_IS are optional, and thus may be omitted without departing from the principles of the present disclosure.

A connection between a source and a body of the cascode transistor 80 is also shown. While this connection is shown externally, those skilled in the art will appreciate that such a connection may also be made internally within the device itself. The connection is further shown via a source-to-body impedance 88. This impedance may be due to internal impedances within the device or may be an externally applied impedance. In various embodiments, the source-to-body impedance 88 may be inductive, capacitive, resistive, or any combination thereof.

The main transistor 78 is a floating body field-effect transistor (FET) device, while the cascode transistor 80 is a body-contacted FET device. Specifically, the cascode transistor 80 is source-to-body connected. As discussed above, body-contacted FET devices do not suffer from the same noise problems as floating-body FET devices at high frequencies due to their ability to remove charge carriers from the body region. However, using a body-connected FET device comes at the cost of decreased transconductance and increased parasitic capacitance compared to floating-body FET devices. Practically speaking, this has little impact on the performance of the stacked transistor pair 76, however, due to the fact that the cascode transistor 80 is operated in a current mode of operation as discussed below. Using a body-contacted FET device for the cascode transistor 80 and a floating-body FET device for the main transistor 78 offers a trade-off between the performance benefits of each design, thereby improving the performance of the stacked transistor pair 76. In one embodiment, the main transistor 78 and the cascode transistor 80 are silicon-on-insulator (SOI) devices. Specifically, the main transistor 78 and the cascode transistor 80 may be thin-film SOI devices that are either partially or fully depleted. Further, the main transistor 78 and the cascode transistor 80 may be metal-oxide-semiconductor field-effect transistors (MOSFETs). However, the present disclosure is not so limited. The main transistor 78 and the cascode transistor 80 may be silicon-on-sapphire (SOS) devices, silicon-on-plastic (SOP) devices, or any other materials system that can be configured as both a floating-body device and a body-contacted device. Further, the main transistor 78 and the cascode transistor 80 may be any device type without departing from the principles described herein.

Figure 1:
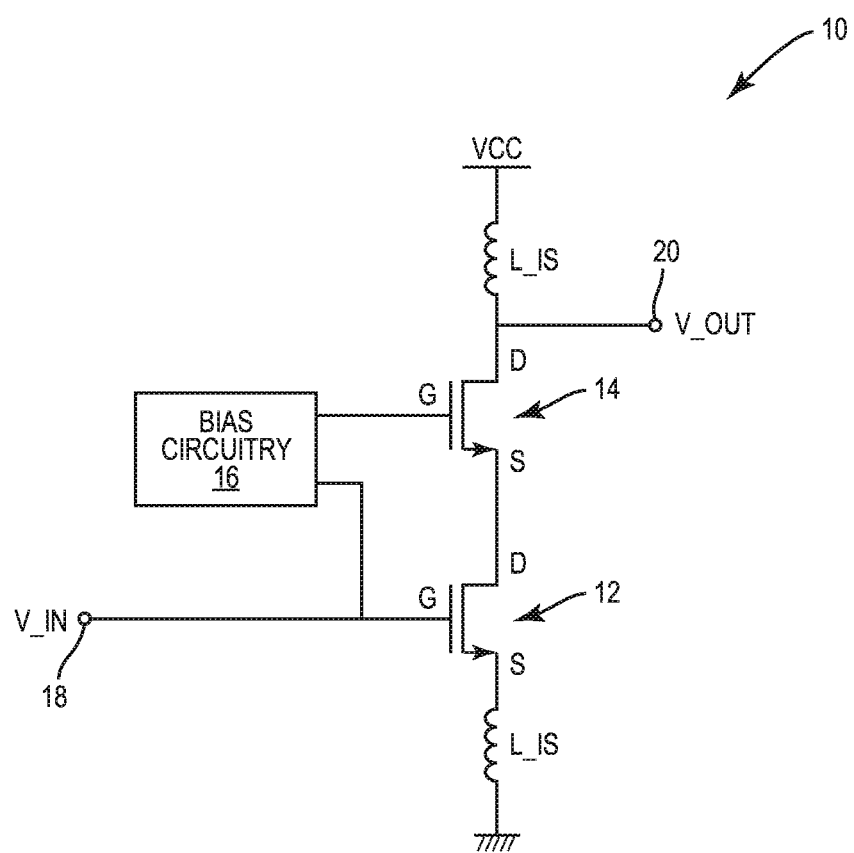
FIG. 1 is a schematic representation of a conventional low noise amplifier (LNA).
Figure 4:
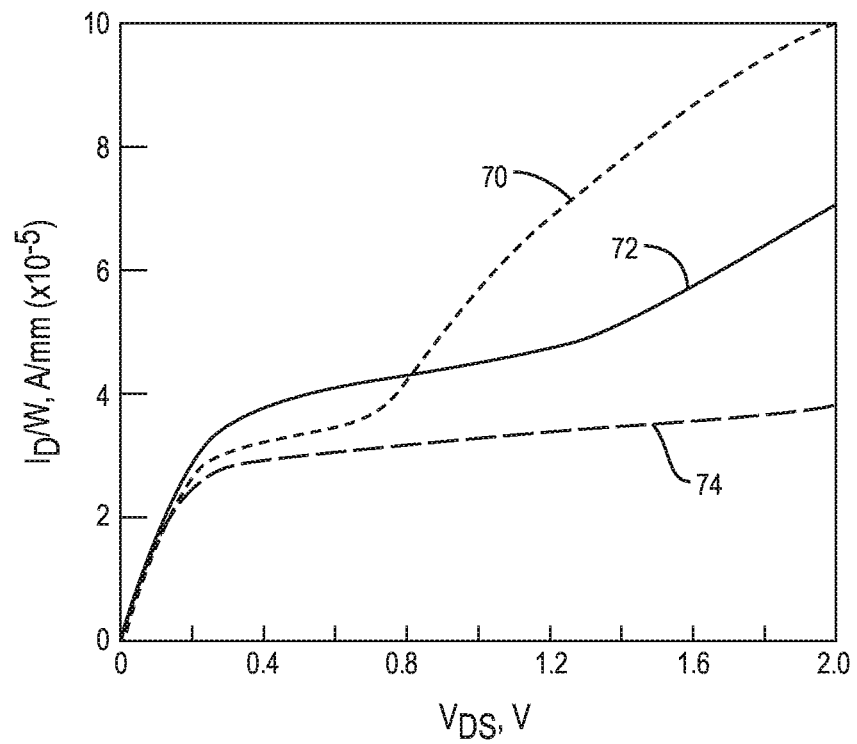
FIG. 4 is a graph illustrating a current density vs. voltage response of various floating-body and body-contacted SOI MOSFETs.

In operation, the biasing circuitry 82 provides biasing signals to the gate contact G of the main transistor 78 and the gate contact G of the cascode transistor 80 such that a majority of the supply voltage VCC is distributed across the cascode transistor 80. Specifically, the biasing signals are provided such that the voltage across the main transistor 78 is less than about 1.5V, and even less than 1.0V in certain circumstances. The voltage across the main transistor 78 is kept lower than 1.5V or 1.0V to avoid approaching the "kink" in the current vs. voltage response of the floating-body device, which is illustrated above in FIG. 4. The remainder of the supply voltage VCC is distributed across the cascode transistor 80. Signals provided at the input node 84 modulate the supply voltage across the main transistor 78 and the cascode transistor 80 in order to provide an amplified version thereof at the output node 86. Due to avoidance of the "kink" in the current vs. voltage response of the main transistor 78, and due to the relatively flat current vs. voltage response of the cascode transistor 80, noise in the stacked transistor pair 76, and specifically noise at high operating frequencies of the stacked transistor pair 76, is significantly reduced. Further, because the main transistor 78, which is a floating-body device, does not suffer from the decreased transconductance and/or increased junction capacitance problems associated with body-contacted devices, the input capacitance of the device will not be adversely affected.

Notably, the concepts described above with respect to the stacked transistor pair 76 may similarly be applied to any number of stacked transistors. Accordingly, FIG. 6A and FIG. 6B illustrate two exemplary transistor stacks 90 according to various embodiments of the present disclosure. FIG. 6A shows a transistor stack 90 including at least two body-contacted devices 92 and a single floating-body device 94. FIG. 6B shows a transistor stack 90 including at least two floating-body devices 94 and a single body-contacted device 92. The additional body-contacted devices 92 and/or floating-body devices 94 may be used, for example, to increase the voltage handling capability of the transistor stack 90. Further, the additional body-contacted devices 92 and/or floating-body devices 94 may be provided to ensure that a supply voltage can be distributed in order to provide maximum performance of the transistor stack 90 (i.e., to avoid "kinks" in the current vs. voltage response of the floating-body devices 94).

Figure 7:
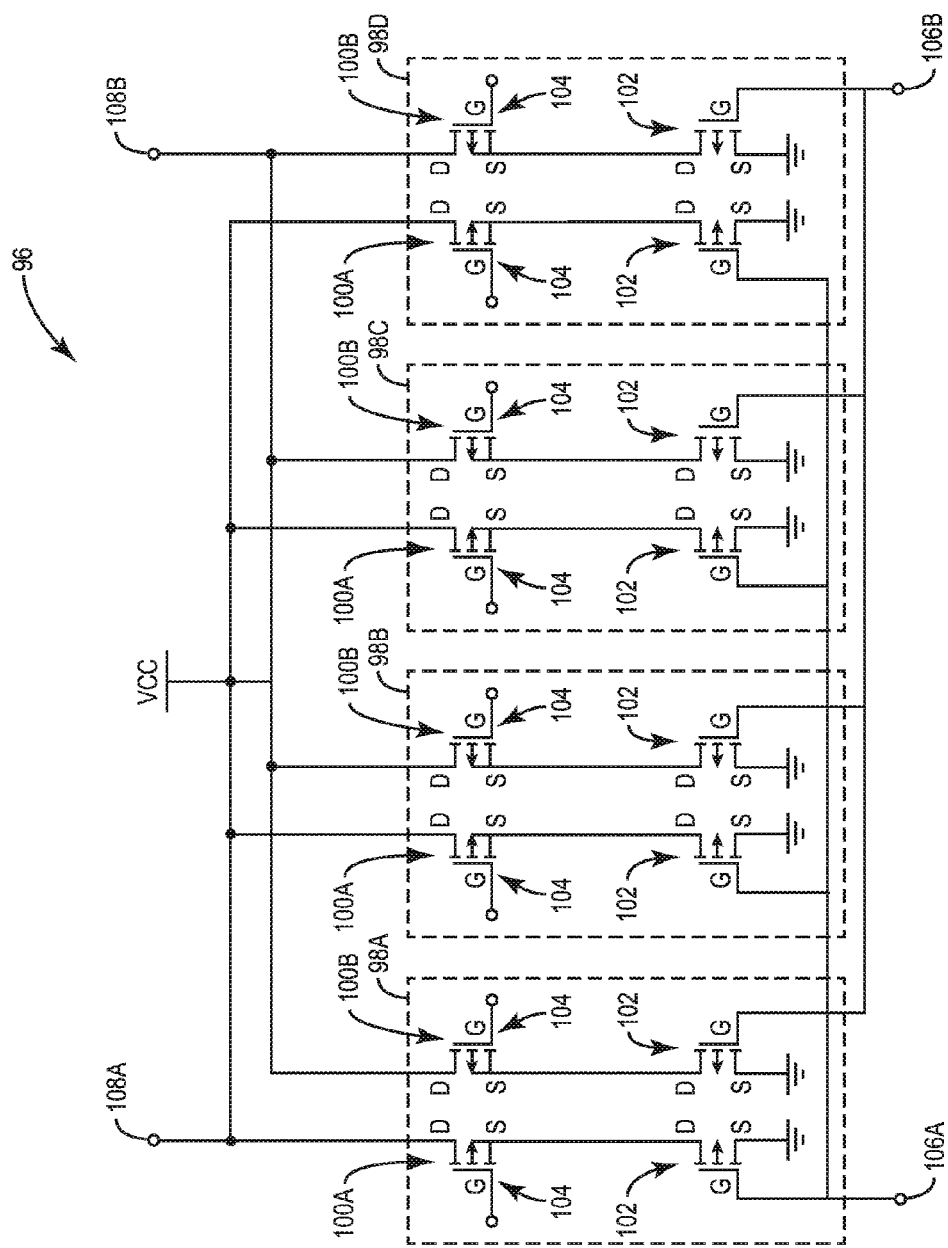
FIG. 7 is a schematic representation of a variable gain low noise amplifier (VGLNA) according to one embodiment of the present disclosure.

The stacked transistor pair 76 discussed above may be used in amplifier circuitry, either alone, or along with one or more other devices. For example, the stacked transistor pair 76 may be used as a low noise amplifier (LNA) for radio frequency (RF) signals. Further circuitry may be used along with the stacked transistor pair 76 to provide additional functionality. FIG. 7 illustrates an exemplary variable gain low noise amplifier (VGLNA) 96 according to one embodiment of the present disclosure. The VGLNA 96 includes a number of differential amplifier phases 98, each of which includes a first LNA 100A and a second LNA 100B. Each LNA 100 in turn includes a main transistor 102 and a cascode transistor 104 as discussed above. The gate contact G of each main transistor 102 in the first LNA 100A is coupled to a first differential input node 106A. The gate contact G of each main transistor 102 in the second LNA 100B is coupled to a second differential input node 106B. Similarly, the drain contact D of each cascode transistor 104 in the first LNA 100A is coupled to a first differential output node 108A. The drain contact D of each cascode transistor 104 in the second LNA 100B is coupled to a second differential output node 108B. Bias circuitry (not shown for simplicity) provides bias signals to the gate contacts of the main transistor 102 and the cascode transistor 104 in each LNA 100 as discussed. While not shown, a supply voltage VCC is provided at the drain contact D of each one of the cascode transistors 104 through one or more isolation impedances. Signals provided at the differential input nodes 106 are amplified and provided at the differential output nodes 108. As discussed above, the main transistor 102 may be a floating-body device, while the cascode transistor 104 may be a body-contacted device. Accordingly, the VGLNA 96 will introduce less noise at high operating frequencies, thereby increasing the performance of the device.

Depending on the desired gain of the VGLNA 96, various differential amplifier phases 98 may be switched in and out of the VGLNA 96 using the cascode transistors 104. That is, if a particular differential amplifier phase 98 is required, the biasing signals can be provided to the gate contacts G of the cascode transistors 104 in the first LNA 100A and the second LNA 100B as discussed above. However, if the differential amplifier phase 98 is not required, the gate contacts G of the cascode transistors 104 in the first LNA 100A and the second LNA 100B are grounded, thereby turning the cascode transistors 104 off and isolating the particular differential amplifier phase 98 from the differential output nodes 108. In one exemplary embodiment wherein the main transistors 102 and the cascode transistors 104 are equally sized, each differential amplifier phase 98 that is active adds an additional 1× gain to the VGLNA 96, such that the gain of the VGLNA 96 can be adjusted by a factor of four. However, sizing the main transistors 102 and the cascode transistors 104 in each one of the differential amplifier phases 98 differently (e.g., using a binary weighted scheme) may provide different gain ratios for the VGLNA 96.

Figure 8:
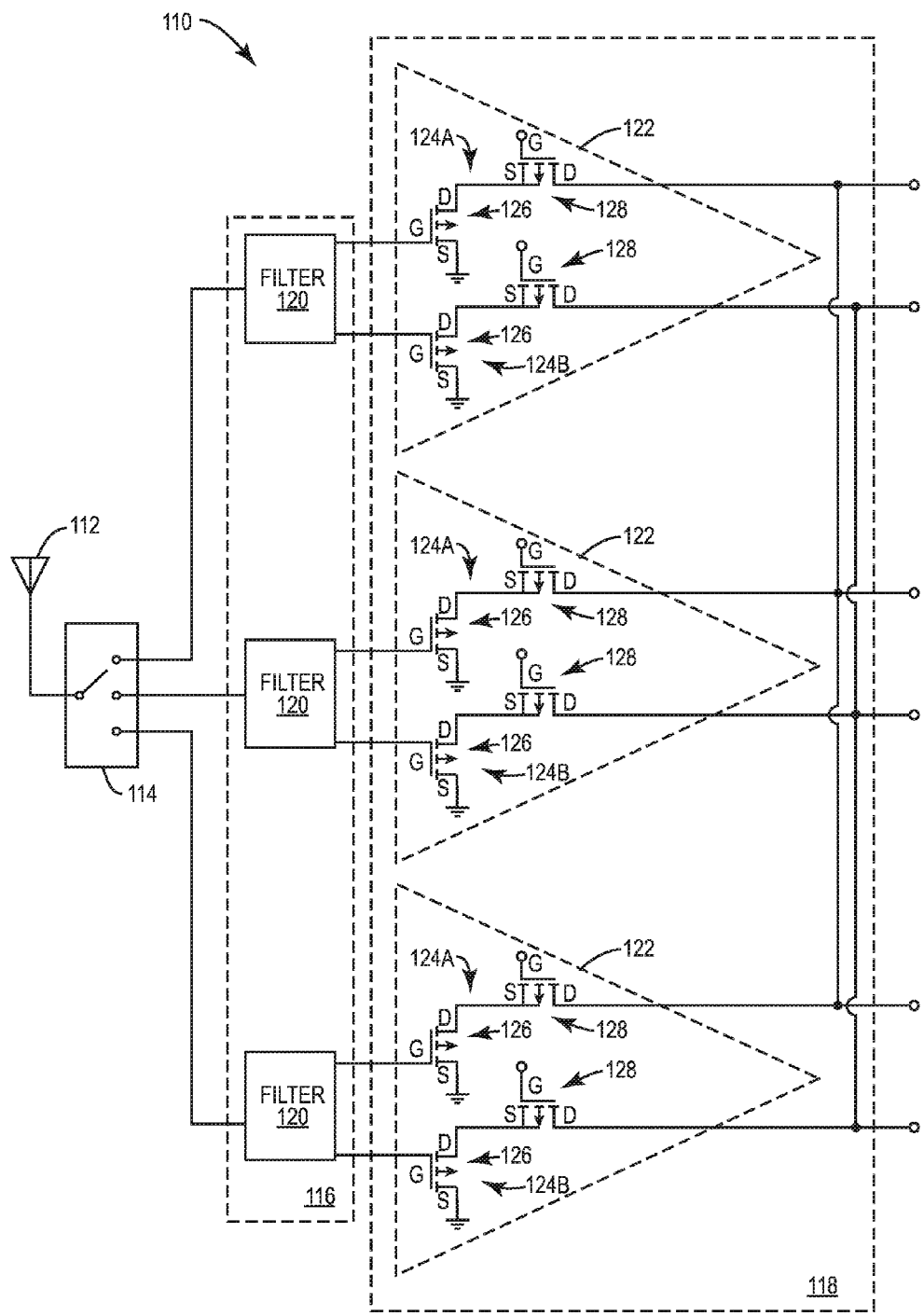
FIG. 8 is a schematic representation of a receiver chain for radio frequency (RF) communications circuitry according to one embodiment of the present disclosure.

LNAs are often used in the receive chain of an RF communications device. Accordingly, FIG. 8 shows a receive chain 110 for an RF communications device according to one embodiment of the present disclosure. The receive chain 110 includes an antenna 112, antenna switching circuitry 114, filter circuitry 116, and LNA circuitry 118. The antenna switching circuitry 114 is configured to selectively couple one or more band filters 120 in the filter circuitry 116 to the antenna 112. Accordingly, signals received at the antenna 112 are filtered by the one or more band filters 120 and provided to a particular LNA 122 in the LNA circuitry 118. The LNAs 122 may be differential LNAs, and thus may include a first stacked transistor pair 124A and a second stacked transistor pair 124B. Biasing circuitry (not shown for simplicity) provides biasing signals to a main transistor 126 and a cascode transistor 128 as discussed above such that the first stacked transistor pair 124A and the second stacked transistor pair 124B operate as discussed above. Further as discussed above, the main transistor 126 may be a floating-body device, while the cascode transistor 128 may be a body-contacted device. Accordingly, the LNA circuitry 118 will introduce less noise at high frequencies, thereby improving the performance of the receiver chain 110.

While the LNAs discussed above with respect to FIGS. 7 and 8 are shown using a stacked transistor pair arranged in a common source configuration in which an input signal is provided to a gate of the main transistor, the principles of the present disclosure may be applied to LNAs having any configuration, such as a common gate configuration in which an input signal is applied to a source of the main transistor.

Consumer demand for additional features and battery life in mobile devices has resulted in a demand for amplifiers with smaller and smaller footprints. One way to reduce the size of the stacked transistor pair 76 discussed above is by monolithically integrating the main transistor 78 and the cascode transistor 80 on a single semiconductor die. Accordingly, FIGS. 9A and 9B show a semiconductor die 130 according to one embodiment of the present disclosure. Specifically, FIG. 9A shows a top view of the semiconductor die 130 while FIG. 9B shows a cross-sectional view of the semiconductor die 130. The semiconductor die 130 includes a substrate 132, a buried oxide layer 134 on the substrate 132, and a device layer 136 on the buried oxide layer 134. The device layer 136 includes a number of diffusions or implants. Specifically, the device layer 136 includes a cascode drain region 138, a combined drain/source region 140, and a main source region 142. A main body region 144 is located between the combined drain/source region 140 and the main source region 142. A cascode body region 146 is located between the cascode drain region 138 and the combined drain/source region 140. A main gate oxide layer 148 is on the main body region 144 and a portion of both the combined drain/source region 140 and the main source region 142. A main gate contact 150 is on the main gate oxide layer 148. A cascode gate oxide layer 152 is on the cascode body region 146 and a portion of both the cascode drain region 138 and the combined drain/source region 140. A cascode gate contact 154 is on the cascode gate oxide layer 152. The cascode body region 146 extends above the "H" shaped cascode gate oxide layer 152 and cascode gate contact 154.

A main transistor 156 is formed by the lateral area between the combined drain/source region 140 and the main source region 142. A cascode transistor 158 is formed by the lateral area between the cascode drain region 138 and the combined drain/source region 140. Due to the combined drain/source region 140, the main transistor 156 and the cascode transistor 158 are internally connected in a source-to-drain fashion. Accordingly, a contact is not required at this point. A cascode drain contact 160 may be provided over the cascode drain region 138, and a main source contact 162 may be provided over the main source region 142. However, while only two devices are shown, any number of devices may be provided and internally connected as shown by sharing a single diffusion. In such an embodiment, the cascode drain region 138 and the main source region 142 are provided at the outermost ends of the semiconductor die 130. The cascode drain contact 160 and the main source contact 162 are thus provided here as well. Providing the main transistor 156 and the cascode transistor 158 such that they share a diffusion reduces the overall size of the resulting stacked semiconductor device.

Those skilled in the art will recognize improvements and modifications to the embodiments of the present disclosure.

All such improvements and modifications are considered within the scope of the concepts disclosed herein and the claims that follow.

What is claimed is:

1. Circuitry comprising:
    a floating-body main field-effect transistor (FET) device comprising a gate contact, a drain contact, and a source contact;
    a body-contacted cascode FET device comprising a gate contact, a drain contact coupled to a supply voltage, and a source contact coupled to the drain contact of the floating-body main FET device and to a body region of the body-contacted cascode FET device; and
    biasing circuitry coupled to the gate contact of the floating-body main FET device and the gate contact of the body-contacted cascode FET device and configured to provide biasing signals to the floating-body main FET device and the body-contacted cascode FET device such that a majority of the supply voltage is provided across the body-contacted cascode FET device.

2. The circuitry of claim 1 wherein the biasing circuitry is configured to provide the biasing signals to the floating-body main FET device and the body-contacted cascode FET device such that at least 75% of the supply voltage is provided across the body-contacted cascode FET device.

3. The circuitry of claim 1 wherein the biasing circuitry is configured to provide the biasing signals to the floating-body main FET device and the body-contacted cascode FET device such that a drain-to-source voltage of the floating-body main FET device is less than about 1.5V.

4. The circuitry of claim 3 wherein the supply voltage is between about 1.0V and 6.0V.

5. The circuitry of claim 1 further comprising:
    power supply circuitry configured to provide the supply voltage to the drain contact of the body-contacted cascode FET device;
    an input node coupled to the gate contact of the floating-body main FET device; and
    an output node coupled to the drain contact of the body-contacted FET device.

6. The circuitry of claim 5 wherein the floating-body main FET device and the body-contacted cascode FET device are configured to amplify a signal provided at the input node using the supply voltage and provide the amplified input signal at the output node.

7. The circuitry of claim 1 further comprising:
    power supply circuitry configured to provide the supply voltage to the drain contact of the body-contacted cascode FET device;
    an input node coupled to the source contact of the floating-body main FET device; and
    an output node coupled to the drain contact of the body-contacted FET device.

8. The circuitry of claim 1 wherein the floating-body main FET device and the body-contacted cascode FET device are thin-film silicon-on-insulator (SOI) devices.

9. The circuitry of claim 8 wherein the floating-body main FET device and the body-contacted cascode FET device are metal-oxide-semiconductor field-effect transistor (MOSFET) devices.

10. The circuitry of claim 9 wherein the floating-body main FET device and the body-contacted cascode FET device are monolithically integrated on a single semiconductor die.

11. The circuitry of claim 10 wherein the floating-body main FET device shares at least one diffusion with the body-contacted cascode FET device.

12. Circuitry comprising:
    one or more floating-body main field-effect transistor (FET) devices;
    one or more body-contacted cascode FET devices coupled in series between a supply voltage and the one or more floating-body main FET devices; and
    biasing circuitry coupled to a gate contact of each of the one or more floating body main FET devices and a gate contact of each of the one or more body-contacted cascode FET devices and configured to provide biasing signals to each of the one or more floating-body main FET devices and each of the one or more body-contacted cascode FET devices such that a source-to-drain voltage of each of the one or more floating-body main FET devices is less than about 1.5V.

13. The circuitry of claim 12 wherein the supply voltage is between about 1.0V and 6.0V.

14. The circuitry of claim 12 wherein the one or more floating-body main FET devices and the one or more body-contacted cascode FET devices are thin-film silicon-on-insulator (SOI) devices.

15. The circuitry of claim 12 further comprising:
    power supply circuitry configured to provide the supply voltage;
    an input node coupled to a gate contact of a first one of the one or more floating-body main FET devices; and
    an output node coupled to a drain contact of a last one of the one or more body-contacted FET devices.

16. The circuitry of claim 15 wherein the one or more floating-body main FET devices and the one or more body-contacted cascode FET devices are configured to amplify a signal provided at the input node using the supply voltage and provide the amplified input signal at the output node.

17. The circuitry of claim 12 wherein the one or more floating-body main FET devices and the one or more body-contacted cascode FET devices are thin-film silicon-on-insulator (SOI) devices.

18. The circuitry of claim 17 wherein the one or more floating-body main FET devices and the one or more body-contacted cascode FET devices are metal-oxide-semiconductor field-effect transistor (MOSFET) devices.

19. The circuitry of claim 18 wherein the one or more floating-body main FET devices and the one or more body-contacted cascode FET devices are monolithically integrated on a single semiconductor die.

20. The circuitry of claim 19 wherein each of the one or more floating-body main FET devices shares at least one diffusion with one of the one or more body-contacted FET devices.

* * * * *